(12) United States Patent
Suga et al.

(10) Patent No.: US 6,887,319 B2
(45) Date of Patent: May 3, 2005

(54) RESIDUE-FREE SOLDER PASTE

(75) Inventors: Tadatomo Suga, Tokyo (JP); Keisuke Saito, Yokohama (JP); Rikiya Kato, Souka (JP); Sakie Yamagata, Souka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 10/413,574

(22) Filed: Apr. 15, 2003

(65) Prior Publication Data

US 2004/0000355 A1 Jan. 1, 2004

(30) Foreign Application Priority Data

Apr. 16, 2002 (JP) ....................................... 2002-113920

(51) Int. Cl.[7] .......................................... B23K 35/365
(52) U.S. Cl. .......................................... 148/23; 148/25
(58) Field of Search ..................................... 148/23, 25

(56) References Cited

U.S. PATENT DOCUMENTS

| | | | | | |
|---|---|---|---|---|---|
| 3,915,729 | A | * | 10/1975 | Eustice | 106/268 |
| 4,298,407 | A | * | 11/1981 | Taylor | 148/24 |
| 4,460,414 | A | * | 7/1984 | Hwang | 148/23 |
| 4,541,876 | A | * | 9/1985 | Hwang | 148/22 |
| 4,557,767 | A | * | 12/1985 | Hwang | 148/23 |
| 4,619,715 | A | * | 10/1986 | Hwang | 148/23 |
| 4,919,729 | A | | 4/1990 | Elmgren et al. | 148/24 |
| 4,994,119 | A | * | 2/1991 | Gutierrez et al. | 148/23 |
| 5,176,759 | A | | 1/1993 | Taguchi | 148/24 |
| 5,211,763 | A | * | 5/1993 | Takemoto et al. | 148/23 |
| 5,919,317 | A | | 7/1999 | Tanahashi et al. | 148/24 |
| 6,103,549 | A | | 8/2000 | Master et al. | 438/106 |
| 6,468,363 | B2 | | 10/2002 | Henderson et al. | 148/23 |
| 2002/0050305 | A1 | * | 5/2002 | Taguchi et al. | 148/24 |

FOREIGN PATENT DOCUMENTS

| | | |
|---|---|---|
| JP | 02290693 | 11/1990 |
| JP | 11163036 | 6/1999 |
| JP | 200158259 | 3/2001 |

\* cited by examiner

*Primary Examiner*—Daniel Jenkins
(74) *Attorney, Agent, or Firm*—Michael Tobias

(57) ABSTRACT

A residue-free solder paste which leaves little or no flux residue after reflow soldering and which have good printability, storage stability, retainability of parts, and wettability, comprises a solder powder mixed with a rosin-free pasty flux. The flux comprises at least one solid solvent and at least one highly viscous solvent in a total amount of 30–90 mass %, in addition to at least one liquid solvent, all the solvents vaporizing at a reflow soldering temperature. The flux may further contain 0.5–12% of a thixotropic agent such as a fatty acid amide and 1–15% of an activator selected from organic acids and their amine salts, the thixotropic agent and activator vaporizing in the presence of the solvents while the solvents are vaporizing.

19 Claims, No Drawings

RESIDUE-FREE SOLDER PASTE

TECHNICAL FIELD

This invention relates to a residue-free solder paste for reflow soldering, which leaves little or no flux residue after reflow soldering therewith. The residue-free solder paste makes it possible to perform resin coating and resin molding after reflow soldering without washing with a cleaning solvent to remove a flux residue.

BACKGROUND ART

Solder pastes are bonding materials formed by mixing a solder powder with a pasty flux. Solder pastes are applied to a workpiece such as a printed circuit board or a silicon wafer by screen printing using a mask or dispensing through a syringe so as to deposit a suitable small amount of the paste on each area to be soldered of the workpiece and are subsequently heated in a furnace to melt the solder and adhere it to the workpiece. This soldering technique is generally called reflow soldering. Various heating methods including infrared heating, laser heating, hot air heating, and hot plate heating can be employed in the furnace (which is also called a reflow furnace). Solder pastes are required to have rheological properties suitable for screen printing or dispensing.

Generally, a flux for a solder paste is prepared by dissolving solid constituents such as rosin, a thixotropic agent, and an activator in a liquid solvent so as to provide the resulting flux with suitable rheological properties. When reflow soldering is carried out with a conventional solder paste having a flux which comprises solid constituents dissolved in a solvent, a considerable part of the solid constituents of the flux remains on or in the vicinity of the resulting soldered joints (i.e., in the soldered areas) as a flux residue.

The flux residue, if remaining in a significant amount in the soldered areas, worsens the appearance of the soldered areas and impedes the contact of the pins of an electronic part to be soldered with the solder paste. Furthermore, the flux residue may cause the insulation resistance between circuits of the workpiece to decrease due to moisture absorption by the flux residue or may cause the circuits to be broken or disconnected by the formation of corrosion products from the flux residue. Therefore, workpieces intended for use in electronic equipment for which high reliability is required have to be washed with a cleaner, after reflow soldering, in order to remove the flux residue remaining in the soldered areas to attain good adhesion of the resin.

In the case of electronic equipment for use in motor vehicles, resin coating in which the soldered areas are coated with a resin or resin molding in which the entire workpiece is sealed in a resin molding is frequently applied using a moisture-proofing resin in order to guarantee the reliability of the equipment. Also in such a case, the workpiece must be washed with a cleaner to remove any flux residue prior to resin coating or molding.

Fluorinated solvents and chlorinated solvents have been used as a cleaner to remove flux residues since they can readily dissolve rosin in the flux residues. However, the use of these solvents is now regulated since their vapors cause ozone depletion, thereby increasing the amount of ultraviolet rays which reach the earth from the sun. This increase is undesirable because ultraviolet rays are harmful and may induce skin cancer in humans.

Furthermore, with an increase in the package density, the spacing between adjacent electronic parts mounted on a workpiece becomes narrow, thereby making it difficult to completely remove flux residues by washing.

A decreased residue solder paste which needs no cleaning after reflow soldering and which is suitable for use in soldering of workpieces to be incorporated into electronic equipment for which high reliability is required is described in U.S. Pat. No. 5,176,759. That decreased residue solder paste, which contains a decreased amount of rosin, does not completely eliminate the formation of a flux residue, but it leaves a flux residue in an amount that is harmless in normal applications.

The decreased flux residue remaining after reflow soldering with the decreased residue solder paste causes no substantial problems in ordinary electronic equipment for which high reliability is required. However, the decreased residue solder paste is not completely satisfactory for present-day electronic equipment for which ultrahigh reliability is required.

Thus, there is a need for a residue-free solder paste, which makes it possible to leave at most 1% of the flux as a flux residue after reflow soldering and which does not cause any adverse effects of a flux residue without being washed with a cleaner.

Rosin is a natural resin from pine trees which comprises abietic acid and its isomers as main constituents. A conventional solder paste for use in electronic equipment is prepared from a rosin-based flux, and rosin has been considered to be an essential flux constituent in view of its effectiveness for modifying the viscosity of the paste and improving the retention of electronic parts by tacky adhesion, as well as in view of the reducing activity of abietic acid and its isomers, the main constituents of rosin, to remove oxides. However, the presence of rosin in a flux for solder paste inevitably results in the formation of a flux residue after reflow soldering in which most constituents of the rosin remain in the residue. Accordingly, rosin cannot be used as a flux constituent in a residue-free solder paste for which it is desired that 99% or more of the flux not remain after reflow soldering.

Some residue-free solder pastes which do not contain rosin have been proposed in the prior art.

U.S. Pat. No. 4,919,729 discloses a fluxless solder paste for use in a reducing atmosphere formed by mixing a solder powder and a binder, which is a monohydric or polyhydric compound having a boiling point between the solidus and liquidus temperatures of the solder powder.

JP H02-290693 A1 discloses a solder paste comprising solder microparticles and an alcohol having a boiling point higher than the melting point of the solder. The solder paste may contain a vaporizable activator, a methyl methacrylate oligomer, and a fatty acid amide. Only liquid solvents are used in the solder pastes disclosed therein.

U.S. Pat. No. 5,919,317 describes a soldering flux and a solder paste which leaves substantially no residue after reflow soldering in a non-reducing atmosphere. The soldering flux contains a polyhydric organic compound having a temperature at which the mass % becomes approximately 0%, as measured by thermal gravimetry, of at least 170° C. and above the solidus temperature of a solder used in the solder paste.

In order to make a solder paste residue-free, the solder paste must be freed of rosin, while maintaining properties, which include printability and dispensability (transferability), retainability of parts (by tacky adhesion), wettability, and storage stability, as good as are attainable with a conventional rosin-based solder paste, in the absence of rosin. Furthermore, if the flux contains any solid or highly viscous constituents such as a thixotropic agent or an activator, such constituents must be vaporized during reflow soldering such that they do not form a flux residue.

None of the residue-free solder pastes proposed in the above-described documents are sufficient in rheological properties. Thus, their viscosities and thixotropic properties are not sufficiently high. As a result, these solder pastes may have the problem that the solder powder in the solder paste tends to separate from the flux, thereby adversely affecting the storage stability and printability of the solder paste through a metal mask and making it difficult to dispense the paste through a syringe. In addition, they do not have sufficient retainability of parts.

DISCLOSURE OF THE INVENTION

The present invention provides a residue-free solder paste in which it is possible to provide the flux with satisfactory rheological properties (viscosity and thixotropic properties), in spite of the absence of rosin in order to make the paste residue-free, so that the solder paste has good performance with respect to retainability of parts, storage stability, printability, dispensability, and wettability, and with which it is possible to perform resin coating or molding after reflow soldering without washing to remove a flux residue.

It has been found that it is possible to provide a flux with satisfactory rheological properties when the flux is prepared using both a solid solvent and a highly viscous solvent in combination with a liquid solvent which has normally been used in a flux. It has also been found that some thixotropic agents and some activators which are solid or highly viscous at room temperature and which do not vaporize by themselves at a reflow soldering temperature, when mixed with a relatively large amount of a solid solvent and a highly viscous solvent which vaporize at the reflow soldering temperature, can be vaporized along with the solid and highly viscous solvents during reflow soldering. Therefore, such thixotropic agents and/or activators can be used to form a residue-free solder paste as required, thereby making it possible to provide a residue-free solder paste which has good performance with respect to printability, dispensability, retainability of parts, wettability, and storage stability and which leaves little or no flux residue.

The present invention provides a residue-free solder paste for use in reflow soldering comprising a solder powder mixed with a pasty flux, the flux comprising at least one solid solvent which is solid at room temperature and which vaporizes at a reflow soldering temperature, at least one highly viscous solvent which is a highly viscous fluid at room temperature and which vaporizes at the reflow soldering temperature, and at least one liquid solvent which is liquid at room temperature and which vaporizes at the reflow soldering temperature.

The term "highly viscous solvent" as used herein indicates that it has a viscosity of at least 10,000 cps at 30° C. with rheological properties like a heavy syrup at room temperature. The term "residue-free" indicates that the solder paste leaves a flux residue of at most 1 mass % of the flux.

In order to provide the solder paste with increased thixotropic properties and/or wettability, the pasty flux may further comprise at least one constituent selected from a thixotropic agent and an activator which vaporize along with other constituents of the flux at the reflow soldering temperature.

In a particularly preferred embodiment of the present invention, the flux has the following composition in mass %:

20–50% of isobornylcyclohexanol as a highly viscous solvent,

10–40% of a solid solvent selected from 2,5-dimethylhexane-2,5-diol and trimethylolpropane, 1–20% of an activator which is a mixture of at least one carboxylic acid amine salt selected from succinic acid monoethanolamine salt and malonic acid monoethanolamine salt and at least one carboxylic acid selected from adipic acid and substituted and unsubstituted benzoic acids, optionally 5–12% of stearamide and/or at most 1% of bis(p-methyl-benzylidene)-sorbitol as a thixotropic agent, and a balance of a liquid solvent selected from octanediol and tetraethylene glycol.

In a residue-free solder paste according to the present invention, the flux used in the solder paste comprises three different types of solvents: at least one solid solvent, at least one highly viscous solvent, and at least one liquid solvent which are distinguished by their state at room temperature. Each solvent vaporizes at a reflow soldering temperature, indicating that its boiling or decomposition temperature is not hither than the reflow soldering temperature.

The solid and highly viscous solvents perform the same role as rosin in a conventional solder paste. Thus, they serve to modify the viscosity of the flux and contribute to retention of the parts placed on the solder paste. The use of these two types of solvents in combination makes it possible to provide the solder paste with sufficient rheological properties, which are comparable to those attainable with a conventional rosin-based solder paste, and, hence, with good transferability, retainability of parts, and storage stability. The rheological properties can be evaluated in terms of viscosity and thixotropic index according to JIS Z3284, Appendix 6. In this testing method, the thixotropic index is preferably between 0.35 and 0.6 and more preferably between 0.4 and 0.6, and most preferably between 0.5 and 0.6.

The total amount of the solid and highly viscous solvents in the flux is preferably in the range of 30–90 mass % of the flux. If it is less than 30 mass %, the thixotropic index of the solder paste is decreased to such an extent that screen printing becomes difficult. If it is more than 90 mass %, the viscosity of the flux becomes too high to form a paste. The total amount of the solid and highly viscous solvents in the flux is preferably in the range of 40–70 mass % and more preferably 45–65 mass %.

The mass ratio of the solid to highly viscous solvent can be selected depending on the particular solid and highly viscous solvents such that the rheological properties of the flux are close to those of a conventional rosin-based flux. Generally, the mass ratio of the solid to highly viscous solvent is in the range of 5:1 to 1:10.

Solid solvents which are particularly useful in the present invention are 2,5-dimethylhexane-2,5-diol and trimethylolpropane. A particularly useful highly viscous solvent is isobornylcyclohexanol. When using these solvents, the mass ratio of the solid to highly viscous solvent is preferably in the range of 2:1 to 1:5. It is also preferable that the solid solvent and the highly viscous solvent comprise 10–40 mass % and 20–50 mass %, respectively, of the flux.

A liquid solvent is also present in the flux, in addition to the solid and highly viscous solvents, in order to dissolve solid and highly viscous constituents including activators and thixotropic agents which may be added to the flux and modify the rheological properties.

Examples of liquid solvents which are useful in the present invention are octanediol and tetraethylene glycol. These solvents have thixotropic properties and can improve the rheological properties of the flux and solder paste.

Each of the above-mentioned useful solid, highly viscous, and liquid solvents is a monohydric or polyhydric compound, which has a reducing activity in the same manner as rosin during reflow soldering, thereby improving the wettability by molten solder.

Thus, according to the present invention, a combination of the three different types of solvents (solid, highly viscous, and liquid solvents) can provide the solder paste with suitable rheological properties and wettability to some extent. Therefore, even if a flux which consists essentially of these solvents is mixed with a solder powder, the resulting solder paste can be sufficiently used for reflow soldering under some reflow soldering conditions or in some applications.

It is preferable, however, to add constituents such as a thixotropic agent and/or an activator to the flux in order to improve the rheological properties and wettability of the flux to the same level as is attainable with a rosin-based flux. To make the solder paste "residue-free", substantially all these additives have to be vaporized during reflow soldering. In conventional residue-free solder pastes, since activators and thixotropic agents are frequently difficult to vaporize, they are excluded from the flux, or even if they are present in the flux, only those compounds which vaporize at the reflow soldering temperature can be used. Therefore, the selection of these additives is extremely limited, and it is often impossible to use an activator or thixotropic agent having sufficient activity or wettability-improving properties.

Some materials which have been used as additives to a flux and which impart good properties to a solder paste do not vaporize by themselves at a reflow soldering temperature but are capable of vaporizing when heated to a reflow soldering temperature in the presence of relatively large amounts of a vaporizable solid solvent and a highly viscous solvent. Thus, while these solvents are vaporizing, such materials vaporize along with the solvents. A solder paste according to the invention may of course contain additives (such as a thixotropic agent or an activator) which vaporize by themselves at a reflow soldering temperature. However, since the flux of a solder paste according to the present invention contains a solid solvent and a highly viscous solvent in large amounts, the flux may also contain additives which do not vaporize by themselves but vaporize along with the solid and highly viscous solvents when heated to a reflow soldering temperature in the presence of these solvents.

A thixotropic agent is an additive for improving the rheological properties of a flux so as to prevent separation in a solder paste of the solder powder and the flux, which have a significantly different specific gravity from each other, to enhance the storage stability of the solder paste and its transferability during printing or dispensing.

In a conventional rosin-based flux, hydrogenated castor oil and a fatty acid amide such as stearamide are used as a thixotropic agent, but they remain with rosin in a flux residue after reflow soldering. Among these thixotropic agents, some fatty acid amides vaporize in the presence of large amounts of solid and highly viscous solvents while these solvents are vaporizing, so they can be used in a residue-free solder paste. Thus, a preferable thixotropic agent which is useful in the present invention is a fatty acid amide and more preferably stearamide.

When stearamide is present in a flux as a thixotropic agent, its content is preferably 3–12 mass %. If the content of stearamide is less than 3 mass %, its effect of preventing separation of the solder powder and the flux is not appreciable. If the content is more than 12 mass %, part of the thixotropic agent may remain as a flux residue after reflow soldering.

Activators in a soldering flux serve to remove by reduction any oxides which are present on the surface of areas to be soldered and on the surface of solder powder particles, thereby cleaning the surface to be soldered so as to allow a molten solder to readily wet the surface and metallically bond thereto. Various compounds such as amines, amine hydrohalides, organic acids, organic acid amine salts, and phosphoric esters have been used as activators.

In a conventional rosin-based flux, a strong activator such as an amine hydrohalide has frequently been used as an activator. However, such a strong activator is not only difficult to vaporize at a reflow soldering temperature but causes problems such as a decrease in insulation resistance or the formation of corrosion products when it remains in a flux residue after reflow soldering.

Substantially all amounts of the activators used in the present invention must be vaporized along with other constituents during reflow soldering. Examples of such activators are carboxylic acids and their amine salts. At least one activator selected from these compounds may be used. If only one activator is present in the flux, it is preferable to select a carboxylic acid amine salt since its activity is higher than that of a carboxylic acid. However, since carboxylic acids are advantageous in that they are less susceptible to aging, it is more preferable to use both at least one carboxylic acid and at least one carboxylic acid amine salt as activators.

Preferably the carboxylic acid is selected from adipic acid and substituted and unsubstituted benzoic acids. The substituted benzoic acids preferably have one or more substituents selected from alkyl and alkoxy groups. Examples of a substituted benzoic acid which is useful as an activator include 4-butylbenzoic acid and 3,4-dimethoxybenzoic acid. Examples of a carboxylic acid amine salt useful ass an activator include monoethanolamine salts of succinic acid and malonic acid.

The at least one activator is preferably present in the flux so as to have a total content of 1–20 mass % and more preferably 3–15 mass %. If the content of the activator is too low, the flux does not have a sufficient activity for removal of oxides. If it is too high, the activator may adversely affect the solder powder by chemical action. When the activator comprises succinic or malonic acid monoethanolamine salt, its content is preferably in the range of 1–6 mass %.

The flux of a solder paste according to the present invention may contain constituents which do not completely vaporize or do not vaporize at all in the presence of other flux constituents at the reflow soldering temperature, as long as the amount of flux residue is at most 1 mass % and preferably at most 0.5 mass % of the flux. For example, the flux may contain up to 1 mass % of constituents which do not vaporize at all during reflow soldering and still result in a flux residue of at most 1 mass % if all other flux constituents vaporize. When such a non-vaporizing constituent is present in the flux, it is preferably selected from compounds which do not have a significant adverse effect on adhesion of resin coatings and moldings when remaining in a slight amount after reflow soldering.

An example of such a non-vaporizable additive is bis(p-methylbenzylidene)-sorbitol, which is a thixotropic agent effective for improvement in prevention of slumping of applied solder paste during heating. This thixotropic agent is effective in a small amount of at most 1 mass % of a flux, and it can provide the flux with suitable rheological properties even in the absence of another thixotropic agent such as stearamide. Of course, these two types of thixotropic agents may be used in combination. The content of bis(p-methylbenzylidene)sorbitol, when it is added to the flux, is at most 1 mass % and preferably at most 0.5 mass %.

The solder paste according to the present invention is prepared by mixing a solder powder with the above-described flux. Various solder powders which can be used to form solder bumps or mount electronic parts on a printed wiring board may be used in the present invention. Solder alloys which are particularly suitable for use in the present invention are those having a liquidus temperature of 320° C. or lower. In this case, reflow soldering temperature is generally 350° C. or lower. The solder paste is particularly suitable for use in reflow soldering at a temperature in the range of 200–350° C. and preferably 240–320° C.

The particle diameter of the solder powder may be in the range of 5–15 µm, although a larger or smaller powder may be used. The proportion of the flux in the solder paste may depend on the particle diameter of the powder, but normally it is in the range of 5–15 mass %. When the solder powder has a particle diameter in the range of 5–15 µm, the proportion of the flux is preferably 8–12 mass % of the solder paste.

The solder paste according to the present invention may be used either in a reducing atmosphere or in a non-reducing atmosphere. The non-reducing atmosphere includes an inert gas atmosphere such as a nitrogen gas atmosphere and an oxidizing atmosphere such as air. Although the reducing atmosphere may be a common reducing atmosphere containing a reducing gas such as hydrogen, another reducing atmosphere which can be employed contains hydrogen free radicals as described in JP 2001-58259 A1 and in the United States Patent Application by Suga et al. filed concurrently with the present application and entitled "Reflow Soldering Method" (the disclosure of which is incorporated by reference).

Reflow soldering in an atmosphere containing hydrogen free radicals may be carried out in a reflow furnace which is capable of being evacuated to obtain a vacuum inside it and which is equipped with a device for feeding a hydrogen gas and a device for plasma generation.

When a solder paste according to the present invention is used for reflow soldering in a non-reducing atmosphere, it is preferable that both a carboxylic acid and a carboxylic acid amine salt be present in the flux as activators. When the soldering atmosphere is a reducing atmosphere, since the atmosphere gas can remove oxides to clean the surface to be soldered, it is possible for the flux to contain only one activator selected from carboxylic acids and their amine salts, or it is possible for the flux to contain no activator at all.

During reflow soldering, all the flux constituents in the solder paste are vaporized nearly completely so that little or no flux residue (at most 1 mass %) remains after reflow soldering. Therefore, when the soldered workpiece is to be incorporated into electronic equipment for which a very high reliability is required, the soldered areas or surface can be subjected to resin coating or molding without washing with a cleaner after reflow soldering. In addition, various problems caused by a flux residue with respect to appearance of the soldered workpiece, contact of soldered pins, adhesion of the coated or molded resin, insulation resistance, and formation of corrosion products can be avoided.

A solder paste according to the present invention can be used for reflow soldering in the same manner as a conventional solder paste. For example, it can be used to form solder bumps on a substrate or to join members to each other (such as an electronic parts having pin, ball, or other terminals and a printed wiring board). The solder paste can be applied to a member which is to undergo reflow soldering by a conventional application method, such as by printing using a mask or by dispensing through a syringe or orifice.

The following examples are presented to further illustrate the present invention. These examples are to be considered in all respects as illustrative and not restrictive. In the examples, all percents are mass % unless otherwise indicated.

EXAMPLE 1

A solder paste was prepared by mixing 89% of a solder powder of an Sn-3Ag-0.5Cu alloy (eutectic melting point= 217° C.) having a particle diameter of 5–15 µm with 11% of a flux having the following composition:

42% isobornylcyclohexanol (highly viscous solvent),
13% trimethylolpropane (solid solvent),
5% stearamide (thixotropic agent),
5% 4-butylbenzoic acid (activator),
5% 3,4-dimethoxybenzoic acid (activator),
3% succinic acid monoethanolamine salt (activator),
16.3% octanediol (liquid solvent), and
10.7% tetraethylene glycol (liquid solvent).

EXAMPLE 2

A solder paste was prepared by mixing 89% of a solder powder of an Sn-3Ag-0.5Cu alloy having a particle diameter of 5–15 µm with 11% of a flux having the following composition:

30% isobornylcyclohexanol (highly viscous solvent),
20% trimethylolpropane (solid solvent),
8% stearamide (thixotropic agent),
5% 4-butylbenzoic acid (activator),
3% malonic acid monoethanolamine salt (activator), and
34% tetraethylene glycol (liquid solvent).

EXAMPLE 3

A solder paste was prepared by mixing 89.5% of a solder powder of an Sn-3Ag-0.5Cu alloy having a particle diameter of 5–15 µm with 10.5% of a flux having the following composition:

42% isobornylcyclohexanol (highly viscous solvent),
10% 2,5-dimethylhexane-2,5-diol (solid solvent),
10% stearamide (thixotropic agent),
0.5% bis(p-methylbenzylidene)-sorbitol (thixotropic agent)
9.5% benzoic acid (activator),
3% succinic acid monoethanolamine salt (activator),
15% octanediol (liquid solvent), and
10% tetraethylene glycol (liquid solvent).

EXAMPLE 4

A solder paste was prepared by mixing 90% of a solder powder of an Sn-37Pb alloy (liquidus temperature=184° C.)

having a particle diameter of 5–15 μm with 10% of a flux having the following composition:

30% isobornylcyclohexanol (highly viscous solvent),
25% trimethylolpropane (solid solvent),
8% stearamide (thixotropic agent),
3% adipic acid (activator),
3% malonic acid monoethanolamine salt (activator), and
31% octanediol (liquid solvent).

EXAMPLE 5

A solder paste was prepared by mixing 90% of a solder powder of an Sn-3Ag-0.5Cu alloy having a particle diameter of 5–15 μm with 10% of a flux having the following composition:

42% isobornylcyclohexanol (highly viscous solvent),
14% trimethylolpropane (solid solvent),
5% 3,4-dimethoxybenzoic acid (activator),
5% 4-butylbenzoic acid (activator),
0.5% bis(p-methylbenzylidene)sorbitol (thixotropic agent)
2% succinic acid monoethanolamine salt (activator),
16.3% octanediol (liquid solvent), and
15.2% tetraethylene glycol (liquid solvent).

COMPARATIVE EXAMPLE 1

This example illustrates a solder paste disclosed in U.S. Pat. No. 5,919,317.

A solder paste was prepared by mixing 88.3% of a solder powder of an Sn-2Ag-36Pb alloy having a particle diameter of 5–15 μm with 11.7% of a flux having the following composition;

66.5% trimethylolpropane (solid solvent), and
33.5% tetraethylene glycol (liquid solvent).

COMPARATIVE EXAMPLE 2

This example illustrates a conventional solder paste using a rosin-based flux.

A solder paste was prepared by mixing 90.5% of a solder powder of an Sn-3Ag-0.5Cu alloy having a particle diameter of 5–15 μm with 9.5% of a flux having the following composition:

65% polymerized rosin (rosin),
7% hydrogenated castor oil (thixotropic agent),
2% diethanolamine hydrobromide (HBr) salt (activator), and
26% diethylene glycol monobutyl ether (liquid solvent).

COMPARATIVE EXAMPLE 3

This example illustrates a decreased residue type solder paste disclosed in U.S. Pat. No. 5,176,759.

A solder paste was prepared by mixing 90.5% of a solder powder of an Sn-37Pb alloy having a particle diameter of 5–15 μm with 9.5% of a flux having the following composition:

30% polymerized rosin (rosin),
30% trimethylolpropane (solid solvent),
4% hydrogenated castor oil (thixotropic agent),
2% bis(p-methylbenzylidene)-sorbitol (thixotropic agent)
2% diethanolamine hydrobromide (HBr) salt (activator), and
32% octanediol (liquid solvent).

Each of the solder pastes prepared in the above examples and comparative examples was evaluated with respect to rheological properties, storage stability, and printability of the paste, as well as wettability, appearance, and adhesion of a resin coating during or after reflow soldering by the following testing methods. The test results are shown in Table 1.

[Testing Methods]

1. Rheological Properties (JIS Z 3284, Appendix 6)

The viscosity and thixotropic index of the solder paste were measured one day after the preparation thereof using a rotational viscometer PCU-505 (manufactured by Malcom, Tokyo, Japan).

2. Storage Stability

After the solder paste was stored at room temperature for 90 days, its viscosity was measured in the same manner as above, and the difference in viscosity from the value measured in the above test for rheological properties was calculated. The storage stability was evaluated by the degree of change in viscosity as follows:

| | |
|---|---|
| ⊚: | less than 20% change in viscosity, |
| ○: | at least 20% change in viscosity, but still printable, |
| X: | separation of the flux from the solder powder, or unprintable. |

3. Printability

The solder paste was used to sequentially print eleven 8-inch semiconductor silicon wafers having lands to be soldered using a metal mask therefor under the following conditions:

printing speed: 0.8 mm/min,
printing pressure: 1.0 kg/cm²,
squeegee: metal squeegee,
thickness of metal mask: 0.1 mm,
openings of the mask: 34,992 dot-shaped openings with a 0.5 mm diameter.

The final, eleventh printed wafer was observed to count the number of dots printed through the mask openings according to JIS Z 2384, Appendix 7 and evaluated by the percent of printed dots as follows:

| | |
|---|---|
| ⊚: | more than 90% of mask openings printed, |
| ○: | 50–90% of mask openings printed, |
| X: | less than 50% of mask openings printed. |

4. Wettability

The 8-inch silicon wafers which were printed with the solder paste in the printability test were subjected to reflow soldering at a peak temperature of about 20 to 50° C. above the liquidus temperature of the solder powder in a reflow furnace to which hydrogen radicals were continuously fed as described in JP 2001-58259 A1. The wettability was evaluated by the spreading of the solder on each land as follows:

| | |
|---|---|
| ⊚: | solder spreading entirely on the lands (100% spreading), |
| ○: | solder spreading partly on the lands (less than 99% spreading), |
| X: | no spreading of solder. |

5. Appearance

The workpieces (wafers) after reflow soldering under the conditions for the wettability test were observed under astereoscopic microscope to confirm if a flux residue remained.

| | |
|---|---|
| ⊚: | little or no flux residue (at most 1% of the flux), |
| ○: | a small amount of flux remained, |
| X: | a large amount of flux remained. |

6. Adhesion of Resin Coating

The workpieces of which the appearance was evaluated were allowed to cool to room temperature and were directly coated with a coating composition for resin coating of silicon wafers (Tuffy TF-1159 manufactured by Hitachi Chemical) without washing with a cleaner. The resin-coated workpieces were subjected to 1000 cycles of heat shocks from −30° C. to +85° C. in a heat shock testing apparatus and then observed under a stereoscopic microscope with respect to peeling and cracking of the resin coating:

TABLE 1

| Example Number | Viscosity (Pa·s) | Thixotropic index | Storage stability | Printability | Wettability | Appearance | Adhesion of resin coating |
|---|---|---|---|---|---|---|---|
| Example 1 | 220 | 0.38 | ⊚ | ○ | ○ | ⊚ | ⊚ |
| Example 2 | 220 | 0.40 | ⊚ | ○ | ○ | ⊚ | ⊚ |
| Example 3 | 250 | 0.50 | ⊚ | ○ | ○ | ⊚ | ⊚ |
| Example 4 | 250 | 0.50 | ⊚ | ○ | ○ | ⊚ | ⊚ |
| Example 5 | 180 | 0.35 | ⊚ | ○ | ○ | ⊚ | ⊚ |
| Comp. Example 1 | 100 | 0.12 | X | X | ○ | ⊚ | ⊚ |
| Comp. Example 2 | 220 | 0.60 | ⊚ | ⊚ | ⊚ | X | X |
| Comp. Example 3 | 180 | 0.60 | ⊚ | ⊚ | ○ | ○ | X |

⊚: no peeling or cracking of the resin coating found,
○: no peeling of the resin coating, but cracks found therein,
X: peeling of the resin coating occurred.

All the solder pastes according to the present invention (Examples 1 to 5) had rheological properties (viscosity and thixotropic index) close to those of a conventional solder paste prepared from a rosin-based flux, and their storage stability, printability, and wettability were good. In addition, little or no residue remained after reflow soldering, so these solder pastes were residue-free, and resin coating could be performed to form a resin film having good adhesion without washing the workpieces with a cleaner.

In contrast, the solder paste of Comparative Example 1 was residue-free and exhibited good adhesion of a resin after reflow soldering therewith, but its rheological properties were poor with respect to both viscosity and thixotropic index, so it exhibited poor storage stability and printability. The solder paste of Comparative Example 2 which were prepared from a conventional rosin-based flux left a large amount of flux residues, which worsened adhesion of a resin coating when it was applied without washing after reflow soldering. Similarly, the decreased residue solder paste of Comparative Example 3 did not provide good adhesion of a resin coating when it was applied without washing with a cleaner.

What is claimed is:

1. A residue-free solder paste for use in reflow soldering comprising a solder powder mixed with a pasty flux, the flux comprising at least one solid solvent which is solid at room temperature and which vaporizes at a reflow soldering temperature, at least one highly viscous solvent which is a highly viscous fluid at room temperature and which vaporizes at the reflow soldering temperature, and at least one liquid solvent which is liquid at room temperature and which vaporizes at the reflow soldering temperature.

2. A residue-free solder paste as recited in claim 1, wherein the total content of the solid solvent and the highly viscous solvent in the flux is 30–90 mass % of the flux.

3. A residue-free solder paste as recited in claim 1, wherein the pasty flux further comprises at least one constituent selected from a thixotropic agent and an activator, each of which vaporizes in the presence of other constituents of the flux while they are vaporizing at the reflow soldering temperature.

4. A residue-free solder paste as recited in claim 1, wherein the solid solvent is selected from 2,5-dimethylhexane-2,5-diol and trimethylolpropane.

5. A residue-free solder paste as recited in claim 4, wherein the highly viscous solvent is isobornylcyclohexanol.

6. A residue-free solder paste as recited in claim 5, wherein the liquid solvent is selected from alkanediols and polyalkylene glycols.

7. A residue-free solder paste as recited in claim 6, wherein the liquid solvent is selected from octanediol and tetraethylene glycol.

8. A residue-free solder paste as recited in claim 3, wherein the thixotropic agent is selected from fatty acid amides.

9. A residue-free solder paste as recited in claim 8, wherein the thixotropic agent is stearamide.

10. A residue-free solder paste as-recited in claim 3, wherein the activator is selected from carboxylic acids and carboxylic acid amine salts.

11. A residue-free solder paste as recited in claim 10, wherein the activator comprises at least one carboxylic acid and at least one carboxylic acid amine salt.

12. A residue-free solder paste as recited in claim 11, wherein the carboxylic acid is selected from adipic acid and substituted and unsubstituted benzoic acids, and the carboxylic acid amine salt is selected from succinic acid monoethanolamine salt and malonic acid monoethanolamine salt.

13. A residue-free solder paste as recited in claim 1, wherein the flux further comprises at most 1 mass % of an additive which is not capable of vaporizing at the reflow soldering temperature.

14. A residue-free solder paste for use in reflow soldering comprising a solder powder mixed with a pasty flux, the flux comprising the following constituents, in mass %:

20–50% of isobornylcyclohexanol as a highly viscous solvent,

10–40% of a solid solvent selected from 2,5-dimethylhexane-2,5-diol and trimethylolpropane, 1–20% of an activator which is a mixture of at least one carboxylic acid amine salt selected from succinic acid monoethanolamine salt and malonic acid monoethanolamine salt and at least one carboxylic acid selected from adipic acid and substituted and unsubstituted benzoic acids, and a balance of a liquid solvent selected from octanediol and tetraethylene glycol.

15. A residue-free solder paste as recited in claim 14, wherein the flux further comprises 5–12% of stearamide as a thixotropic agent.

16. A residue-free solder paste as recited in claim 14, wherein the flux further comprises at most 1% of bis(p-methylbenzylidene)sorbitol as a thixotropic agent.

17. A residue-free solder paste as recited in claim 1, wherein the reflow soldering temperature is not higher than 350° C.

18. A reflow soldering method comprising heating a solder paste as recited in claim 1 to melt the solder powder and vaporize at least 99 mass % of the flux.

19. A reflow soldering method as recited in claim 18, including heating the solder paste to at most 350° C.

* * * * *